US007504869B2

(12) United States Patent
Tobita et al.

(10) Patent No.: US 7,504,869 B2
(45) Date of Patent: Mar. 17, 2009

(54) FREQUENCY DIVIDING CIRCUIT, POWER SUPPLY CIRCUIT AND DISPLAY DEVICE

(75) Inventors: Youichi Tobita, Tokyo (JP); Seiichirou Mori, Tokyo (JP); Hiroyuki Murai, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 0 days.

(21) Appl. No.: 11/265,076

(22) Filed: Nov. 3, 2005

(65) Prior Publication Data
US 2006/0208775 A1 Sep. 21, 2006

(30) Foreign Application Priority Data
Mar. 16, 2005 (JP) .............................. 2005-074777

(51) Int. Cl.
*H03K 21/00* (2006.01)
(52) U.S. Cl. ..................... 327/117; 327/115; 327/538
(58) Field of Classification Search ................. 327/117, 327/115
See application file for complete search history.

(56) References Cited

U.S. PATENT DOCUMENTS

| 4,800,339 | A | * | 1/1989 | Tanimoto et al. ............. 330/253 |
| 5,027,036 | A | * | 6/1991 | Ikarashi et al. ............ 315/169.3 |
| 5,359,241 | A | * | 10/1994 | Hasegawa et al. ............ 326/126 |
| 5,594,380 | A | * | 1/1997 | Nam ............................ 327/390 |
| 6,459,658 | B1 | * | 10/2002 | Fujita et al. .................. 368/203 |
| 6,853,582 | B1 | * | 2/2005 | Matsuda et al. ......... 365/185.18 |
| 2003/0006825 | A1 | | 1/2003 | Lee et al. |
| 2004/0012584 | A1 | * | 1/2004 | Sasaki et al. ................. 345/204 |
| 2004/0041613 | A1 | * | 3/2004 | Chen ........................... 327/333 |

FOREIGN PATENT DOCUMENTS

| JP | 2000-278937 | 10/2000 |
| JP | 2004-229434 | 8/2004 |

OTHER PUBLICATIONS

Chinese Office Action Application No. 200620058828.8 dated Jun. 13, 2008, and Translation thereof.

* cited by examiner

*Primary Examiner*—Donovan Lincoln
*Assistant Examiner*—Ryan C Jager
(74) *Attorney, Agent, or Firm*—Buchanan Ingersoll & Rooney PC

(57) ABSTRACT

A level shifter and a charge pump circuit are added, among cascade-connected unit frequency dividing circuits forming a frequency dividing circuit, to the unit frequency dividing circuit in the first stage. The charge pump circuit boosts an input voltage based on a dot clock signal, and supplies the booster voltage to the unit frequency dividing circuit in the first stage. The unit frequency dividing circuit in the first stage, which is driven by the booster voltage, attains an improved current driving capability. The improved current driving capability of the unit frequency dividing circuit in the first stage to which the dot clock signal of high frequency is input leads to a widened operating margin of the frequency dividing circuit.

15 Claims, 13 Drawing Sheets

F I G . 1
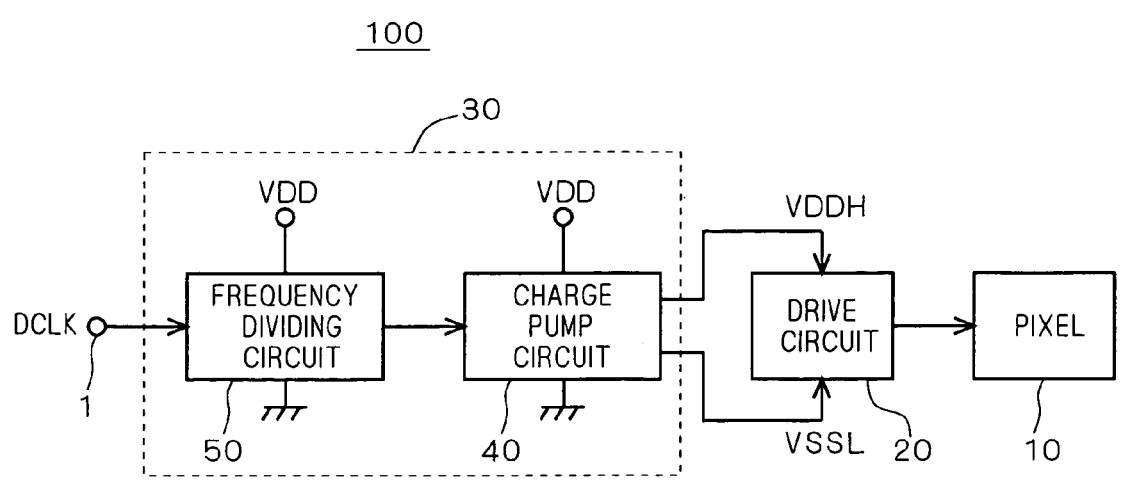

F I G . 3
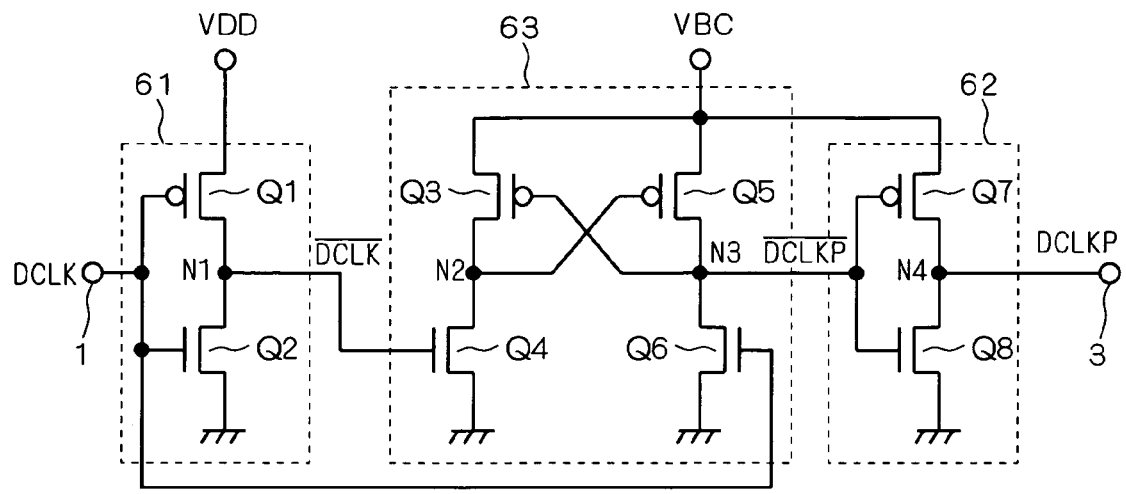
F I G . 4
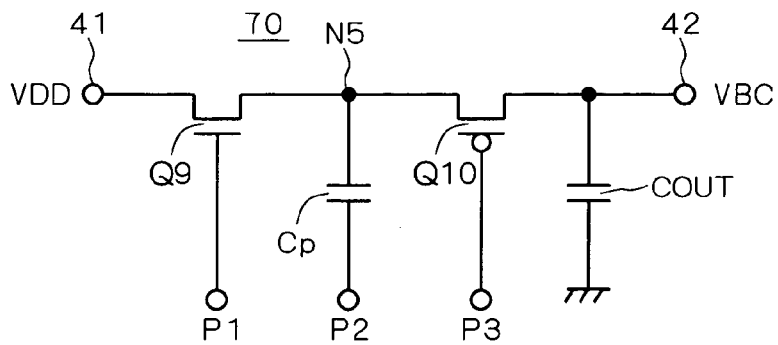
F I G . 5
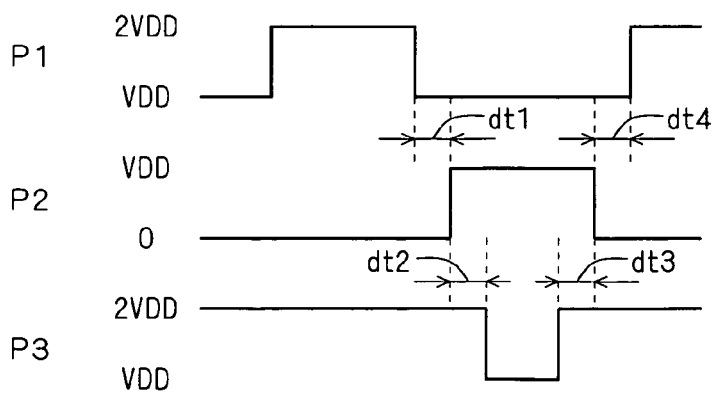

FREQUENCY DIVIDING CIRCUIT, POWER SUPPLY CIRCUIT AND DISPLAY DEVICE

BACKGROUND OF THE INVENTION

1. Field of the Invention

The present invention relates to operating margin improvements of a frequency dividing circuit, a power supply circuit and a display device.

2. Description of the Background Art

A flat display device includes a power supply circuit and a drive circuit as well as a display element (pixel) made of liquid crystal, organic EL, or the like. The power supply circuit and drive circuit are formed by using thin film transistors (TFTs) that are formed on a substrate simultaneously with the display element.

The power supply circuit includes a frequency dividing circuit and a charge pump circuit, and is supplied with a voltage VDD from an external system and a voltage VSS (GND). The frequency dividing circuit lowers the frequency of a high-frequency clock signal input thereto, and outputs a low-frequency clock signal to the charge pump circuit. The reason for lowering the frequency of the clock signal is to minimize reactive current flowing to the charge pump circuit, thus enhancing energy efficiency of the power supply circuit.

The charge pump circuit uses the low-frequency clock signal, VDD (input voltage) and VSS to produce a voltage VDDH (second booster voltage) higher than VDD, and a voltage VSSL lower than VSS. The drive circuit is activated by VDDH and VSSL to produce various kinds of signals for driving pixels.

The frequency dividing circuit includes a plurality of cascade-connected unit frequency dividing circuits (binary counters). The unit frequency dividing circuits each lower the frequency of an input signal to half. Thus, a frequency dividing circuit having n stages of cascade-connected unit frequency dividing circuits lowers the frequency of an input signal to $(1/2^n)$.

A display device having a pixel, a drive circuit and a power supply circuit integrated into one another is in general supplied with three signals as a clock signal, namely, a dot clock signal (input signal) for producing control signals inside the display device, a horizontal synchronizing signal, and a vertical synchronizing signal. The frequencies of the horizontal and vertical synchronizing signals are lower than a frequency that satisfies the load-current-supplying capability of the power supply circuit. Thus, the dot clock signal is input to the frequency dividing circuit.

The frequency of the dot clock signal depends on the number of pixels of a display device, which is approximately 5 MHz in a QVGA-size display device used in a cellular phone. An operation of approximately 5 MHz is therefore required of the unit frequency dividing circuit in the first stage. The reference voltage VDD depends on an external LSI circuit, which in general is approximately 3 V.

Prior art pertinent to the present invention is disclosed in Japanese Patent Application Laid-Open No. 2000-278937.

The present TFT formed by a low-temperature polysilicon process, however, is low in current driving capability, and will not follow a high-frequency input signal well. With variations in characteristic values (especially, a threshold voltage) of the TFT, the unit frequency dividing circuit in the first stage is supplied with the highest frequency signal that leaves virtually no operating margin. This results in a reduction in operating margin of the frequency dividing circuit as a whole.

SUMMARY OF THE INVENTION

It is an object of the present invention to provide a frequency dividing circuit, a power supply circuit, and a display device of wide operating margins in a drive-circuit-integrated type display device.

In an aspect of the present invention, a frequency dividing circuit dividing the frequency of an input signal and outputting the same includes a plurality of unit frequency dividing circuits, and a booster circuit. The plurality of unit frequency dividing circuits are cascade-connected. The booster circuit supplies a booster voltage to at least the unit frequency dividing circuit in the first stage.

At least the unit frequency dividing circuit in the first stage of the frequency dividing circuit is activated by using the booster voltage. This leads to an improvement in current driving capability of transistors forming the unit frequency dividing circuit, resulting in a widened operating margin of the frequency dividing circuit including thin-film transistors.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram illustrating the structure of a display device according to a first preferred embodiment of the present invention;

FIG. 3 is a circuit diagram illustrating the structure of a level shifter according to the first preferred embodiment;

FIG. 4 is a circuit diagram illustrating the structure of a charge pump circuit according to the first preferred embodiment;

FIG. 5 illustrates waveforms explaining the operation of the charge pump circuit according to the first preferred embodiment;

DESCRIPTION OF THE PREFERRED EMBODIMENTS

First Preferred Embodiment

Figure 2:
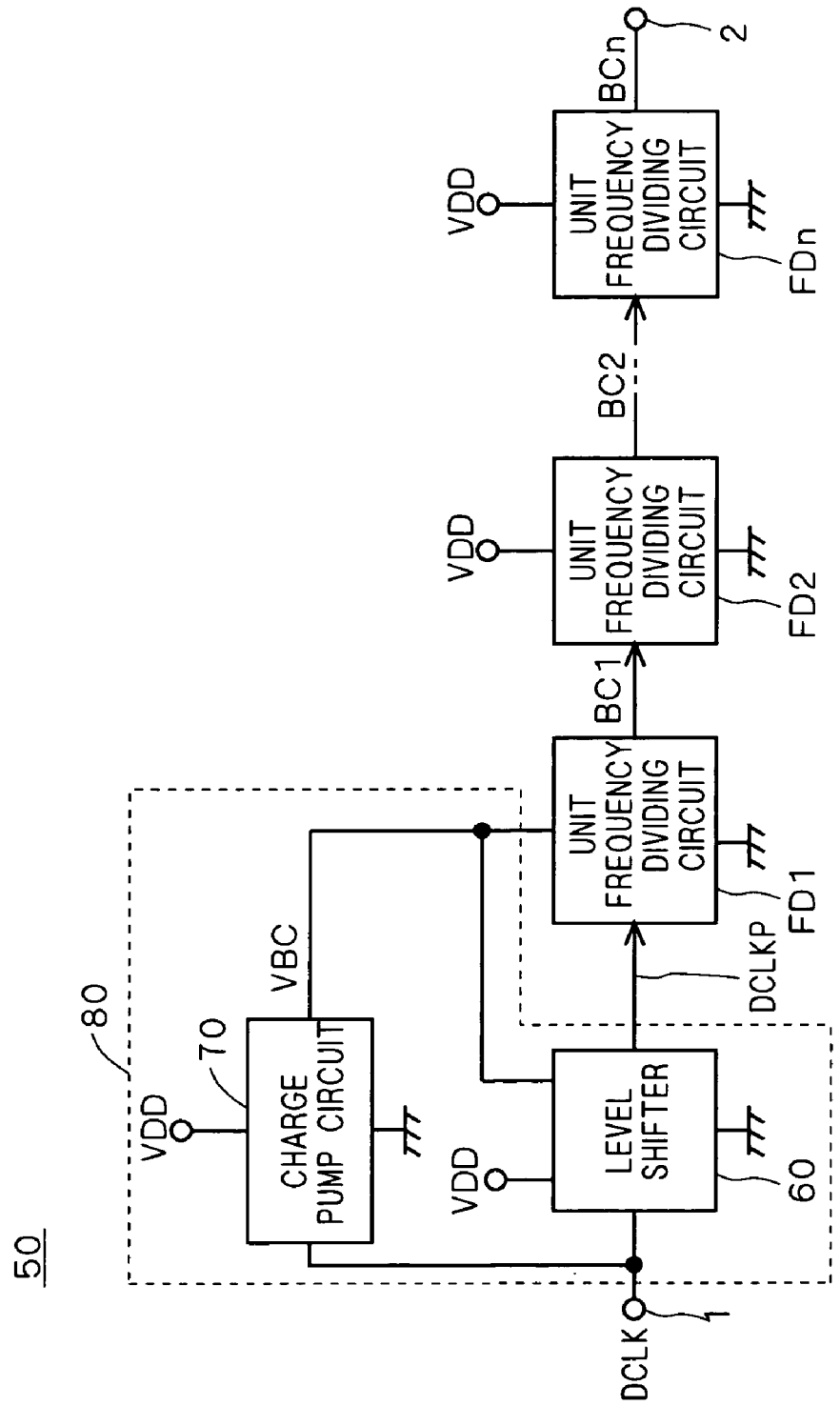
FIG. 2 is a block diagram illustrating the structure of a frequency dividing circuit according to the first preferred embodiment.

<A. Circuit Structure>
<A-1. General Structure>

FIG. 1 is a block diagram illustrating the structure of a display device 100 according to a first preferred embodiment of the present invention.

A pixel 10 is connected to the output of a drive circuit 20. The drive circuit 20 is supplied with the voltages VDDH and VSSL from a power supply circuit 30. A dot clock signal (input signal: hereafter sometimes referred to simply as a "signal DCLK") is input to the power supply circuit 30 from a terminal 1. The signal DCLK is at a voltage VDD on its H level and at a ground voltage (0 V, for example) on its L level.

The power supply circuit 30 produces the voltage VDDH higher than the voltage VDD and the voltage VSSL lower than the ground voltage VSS based on the signal DCLK, and outputs those voltages to the drive circuit 20. The drive circuit 20 receives VDDH and VSSL from the power supply circuit 30 to produce and output various kinds of signals for driving the pixel 10.

<A-2. Circuit Structure of Power Supply Circuit 30>

The power supply circuit 30 includes a charge pump circuit 40 (second booster circuit) and a frequency dividing circuit 50. The frequency dividing circuit 50 converts the signal DCLK to a low-frequency signal and outputs the same to the charge pump circuit 40.

Based on the signal from the frequency dividing circuit 50, the charge pump circuit 40 boosts the voltage VDD to output the voltage VDDH, and produces and outputs the low voltage VSSL.

<A-3. Circuit Structure of Frequency Dividing Circuit 50>

FIG. 2 is a block diagram illustrating the structure of the frequency dividing circuit 50, which will be described in detail.

The frequency dividing circuit 50 includes n number of cascade-connected unit frequency dividing circuits FD1 to FDn, and a circuit 80. An output $BC_n$ of the unit frequency dividing circuit FDn in the last stage is connected to the charge pump circuit 40 (see FIG. 1).

The circuit 80 supplies a voltage VBC (booster voltage) to the unit frequency dividing circuit FD1. The signal DCLK is input to the unit frequency dividing circuit FD1 via the circuit 80. The circuit 80 includes a charge pump circuit 70 and a level shifter 60. Based on the signal DCLK, the charge pump circuit 70 boosts the voltage VDD to produce the voltage VBC, and supplies the voltage VBC to the unit frequency dividing circuit FD1 and the level shifter 60.

Upon input of the signal DCLK, the level shifter 60 converts its H level (one side level) to the voltage VBC and outputs the same. The level shifter 60 is provided to prevent the occurrence of flow-through current due to the supply of the voltage VBC to the unit frequency dividing circuit FD1.

The unit frequency dividing circuit FD1, which is activated by the voltage VBC, outputs a signal BC1 being at the voltage VBC on its H level. This voltage level is input to the unit frequency dividing circuit FD2 which is activated by the voltage VDD, but no flow-through current flows then, thus causing no problem.

<A-4. Structure of Level Shifter 60>

FIG. 3 is a circuit diagram illustrating the structure of the level shifter 60. The level shifter 60 includes inverters 61, 62 and a level shift circuit 63.

In FIG. 3, transistors Q2, Q4, Q6 and Q8 are N-type TFTs, and transistors Q1, Q3, Q5 and Q7 are P-type TFTs.

The inverter 61 includes the transistors Q1 and Q2. The transistor Q1 has a source supplied with the voltage VDD, and a drain connected to the drain of the transistor Q2 at a node N1. The source of the transistor Q2 is grounded. The gates of the transistors Q1 and Q2 are connected to the terminal 1, and the gate of the transistor Q6 forming the level shift circuit 63. The signal DCLK is input to the terminal 1.

Upon input of an L level signal to the inverter 61, the transistor Q1 changes to the ON state, and the transistor Q2 changes to the OFF state. As a result, an H level (voltage VDD) signal is output from the node N1.

Then, upon input of an H level signal, the transistor Q1 changes to the OFF state, and the transistor Q2 changes to the ON state. As a result, an L level (0 V, for example) signal is output from the node N1.

In summary, the inverter 61 operates in such a manner as to output a signal $\overline{DCLK}$ of opposite phase to the signal DCLK.

The level shift circuit 63 includes the transistors Q3 to Q6. The transistor Q3 has a source connected to the source of the transistor Q5 and the output of the charge pump circuit 70 (see FIG. 2), and supplied with the voltage VBC.

The transistor Q3 has a drain connected to the drain of the transistor Q4 at a node N2. The source of the transistor Q4 is grounded. The drain of the transistor Q5 is connected to the drain of the transistor Q6 at a node N3. The source of the transistor Q6 is grounded. The gate of the transistor Q3 is connected to the node N3, and the gate of the transistor Q5 is connected to the node N2. The gate of the transistor Q4 is connected to the node N1, and the gate of the transistor Q6 is connected to the terminal 1.

Upon input of an H level signal to a first input (gate of the transistor Q4) and an L level signal to a second input (gate of the transistor Q6) in the level shift circuit 63, the transistor Q4 changes to the ON state, and the transistor Q6 changes to the OFF state.

Following the transistor Q4's change to the ON state, the node N2 is grounded via the transistor Q4 and changes to the L level. Following the node N2's change to the L level, the transistor Q5 changes to the ON state. As a result, the node N3 is connected to the voltage VBC via the transistor Q5 and changes to the H level. At this time, the H level of the node N3 becomes the voltage VBC higher than the voltage VDD which is the H level of the signal DCLK.

Then, upon input of an L level signal to the first input and an H level signal to the second input, the transistor Q4 changes to the OFF state, and the transistor Q6 changes to the ON state. Following the transistor Q6's change to the ON state, the node N3 is grounded via the transistor Q6 and changes to the L level. Following the node N3's change to the L level, the transistor Q3 changes to the ON state.

As a result, the node N2 is connected to the voltage VBC via the transistor Q3 and changes to the H level. Thus, the H level of the node N2 is supplied from the voltage VBC higher than the H level of the signal DCLK.

In summary, the level shift circuit 63 operates, upon input of signals having opposite phases to the first and second inputs, in such a manner as to output signals having opposite phases with the H levels being the voltage VBC.

The inverter 62 includes the transistors Q7 and Q8. The transistor Q7 has a source connected to the source of the transistor Q5 and supplied with the voltage VBC, and a drain connected to the drain of the transistor Q8 at a node N4. The source of the transistor Q8 is grounded.

The gates of the transistors Q7 and Q8 are connected to the level shift circuit 63 at the node N3. The node N4 is connected to a terminal 3 that outputs a signal DCLKP.

The inverter 62 operates in a similar fashion as the inverter 61, so the description thereof is omitted here.

<A-4-1. Operation of Level Shifter 60>

Upon input of the signal DCLK from the terminal 1 to the inverter 61, the inverter 61 outputs the inversion signal $\overline{DCLK}$ to the first input of the level shift circuit 63. The signal DCLK is input to the second input of the level shift circuit 63.

Following the input of the inversion signal $\overline{DCLK}$ to the first input and the signal DCLK to the second input, the level shift circuit 63 outputs from the nodes N2 and N3 signals having opposite phases with the H levels being the voltage VBC.

The node N3 outputs a signal $\overline{DCLKP}$ in phase with $\overline{DCLK}$ to the inverter 62. The inverter 62 inverts the inversion signal $\overline{DCLKP}$ to output the signal DCLKP.

Since the driving capability of the level shift circuit 63 usually cannot be increased, the inverter 62 acts as a buffer of the level shift circuit 63. When the driving capability of the level shift circuit 63 can be increased relatively to a load, the inverter 62 is not required. Conversely, when the load is great, it is required to increase the number of steps in the buffer.

<A-5. Structure of Charge Pump Circuit 70>

FIG. 4 is a circuit diagram illustrating the structure of the charge pump circuit 70. There are various kinds of charge pump circuits, and FIG. 4 shows a booster-voltage-producing type among them.

Upon application of the voltage VDD to a terminal 41, the charge pump circuit 70 boosts the voltage VDD to output the voltage VBC from a terminal 42.

The charge pump circuit 70 includes a transistor Q9 which is an N-type TFT, a transistor Q10 which is a P-type TFT, capacitance Cp, and output capacitance COUT.

The transistor Q9 (first transistor) has a drain (one side terminal) connected to the terminal 41 and supplied with VDD (input voltage), and a source (other side terminal) connected to the source (one side terminal) of the transistor Q10 (second transistor) at a node N5. The node N5 is connected to one end of the capacitance Cp (first capacitance element). The drain (other side terminal) of the transistor Q10 is connected to one end of the output capacitance COUT (second capacitance element). The other end of the output capacitance COUT is grounded.

A signal P1 is input to the gate of the transistor Q9. A signal P2 is input to the other end of the capacitance Cp. A signal P3 is input to the gate of the transistor Q10.

The signals P1 to P3 are produced by using the signal DCLK.

<A-5-1. Operation of Charge Pump Circuit 70>

FIG. 5 illustrates waveforms explaining the operation of the charge pump circuit 70.

In the initial state, the signal P1 is at an L level (VDD), the signal P2 is at an L level (VSS: 0 V, for example), and the signal P3 is at an H level (2·VDD).

Then, the signal P1 changes to an H level (2·VDD) with the signal P2 being at the L level, whereby the transistor Q9 changes to the ON state thus charging the capacitance Cp to VDD. As a result, the node N5 becomes VDD in voltage level.

The source voltage of the transistor Q9 thus becomes VDD. In order for the transistor Q9 to change to the ON state in a non-saturated region with no loss of threshold value voltage, the signal P1 is required to be at a voltage of 2·VDD.

With the signal P3 being at the H level (2·VDD), the transistor Q10 is VDD in voltage across its gate and source and is therefore in the OFF state.

The signal P1 changes to the L level again, whereby the transistor Q9 changes to the OFF state. Then, after a lapse of time dt1 following the transistor Q9's change to the OFF state, the signal P2 changes to an H level (VDD). Since the capacitance Cp has been charged up to VDD, the node N5 becomes 2·VDD in voltage level.

If the signal P2 changes to the H level before the lapse of time dt1, the transistor Q9 being in the ON state causes current to flow from the node N5 to the terminal 41, hindering the node N5 from becoming 2·VDD in voltage level. For this reason, it is required that the signal P2 change to the H level after a lapse of time dt1.

Then, after a lapse of time dt2 following the signal P2's change to the H level, the signal P3 changes to an L level (VDD). Following the signal P3's change to the L level, the transistor Q10 becomes −VDD in voltage across its gate and source, and changes to the ON state.

This causes current to flow from the node N5 to the output capacitance COUT thus charging the output capacitance COUT. As a result, the terminal 42 rises by a certain value in voltage level (the node N5 drops in voltage level).

If the signal P3 changes to the L level before the lapse of time dt2, the transistor Q10 changes to the ON state before becoming −VDD in voltage across its gate and source. This slows the speed of charging the output capacitance COUT, resulting in a reduction in charging efficiency.

The signal P3 then changes to the H level, whereby the transistor Q10 changes to the OFF state. After a lapse of time dt3 following the transistor Q10's change to the OFF state, the signal P2 changes to the L level (0 V), and the node N5 simultaneously drops in voltage level as well.

If the signal P2 changes to the L level before the lapse of time dt3, the node N5 drops lower than the output side in voltage level. With the transistor Q10 being in the ON state, this causes current to flow backward from the output side to the node N5 side, resulting in a reduction in output level, namely, a reduction in charging efficiency.

After a lapse of time dt4 following the signal P2's change to the L level, the signal p1 changes from the L level to the H level. The transistor Q9 then changes to the ON state thus charging the capacitance Cp to VDD again, whereby the node N5 becomes VDD in voltage level.

If the signal p1 changes to the H level before the lapse of time dt4, the capacitance Cp starts being charged before the transistor Q9 becomes VDD in voltage across its gate and source. This slows the charging speed, resulting in a reduction in charging efficiency.

By repeating the operation described above, the voltage VBC rises up to 2·VDD under no-load conditions where a load current is 0, and when a load current flows, drops correspondingly to the load current.

<A-6. Structure of Unit Frequency Dividing Circuit>

Figure 6:
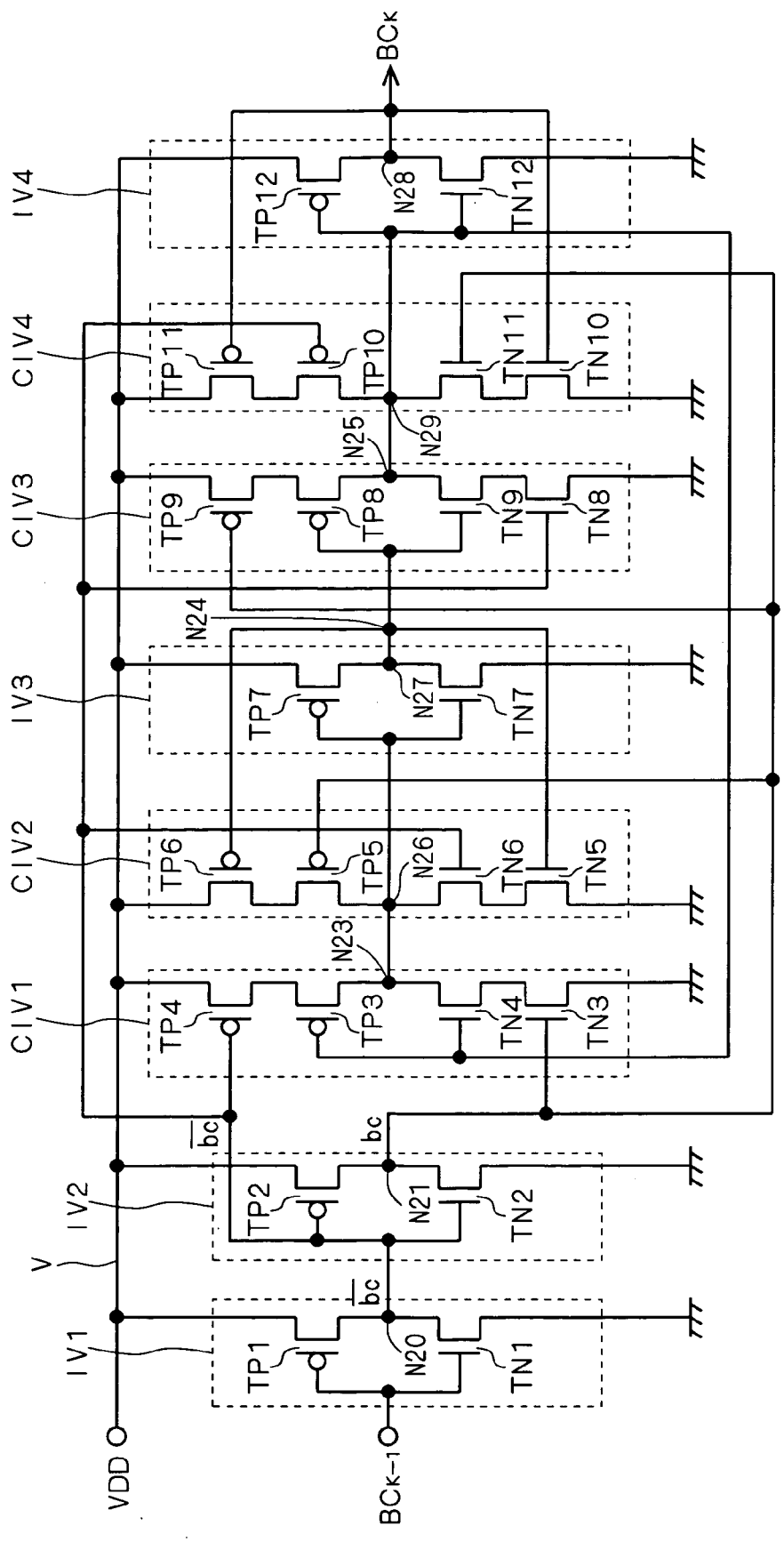
FIG. 6 is a circuit diagram illustrating the structure of a unit frequency dividing circuit according to the first preferred embodiment.

FIG. 6 is a circuit diagram illustrating the structure of a unit frequency dividing circuit.

The unit frequency dividing circuit is supplied with a signal $BC_{k-1}$ and outputs a signal $BC_k$. The signal $BC_k$ is half the frequency of the signal $BC_{k-1}$.

FIG. 6 illustrates a generalized circuit. When applied to the unit frequency dividing circuit FD1 shown in FIG. 2, the signal $BC_{k-1}$ corresponds to the signal DCLKP, the signal $BC_k$ to the signal BC1, and the voltage VDD to the voltage VBC.

In FIG. 6, transistors TP1 to TP12 are P-type TFTs, and transistors TN1 to TN12 are N-type TFTs.

The FIG. 6 circuit includes four common inverters IV1 to IV4, and four clocked inverters CIV1 to CIV4.

The inverter IV1 includes the transistor TP1 having a source connected to a voltage line V supplied with the voltage VDD, and the transistor TN1 having a drain connected to the drain of the transistor TP1 at a node N20. The source of the transistor TN1 is grounded. The signal $BC_{k-1}$ is input the gates of the transistors TP1 and TN1.

The inverter IV2 includes the transistor TP2 having a source connected to the voltage line V, and the transistor TN2 having a drain connected to the drain of the transistor TP2 at a node N21. The source of the transistor TN2 is grounded.

The inverter IV3 includes the transistor TP7 having a source connected to the voltage line V, and the transistor TN7 having a drain connected to the drain of the transistor TP7 at a node N27. The source of the transistor TN7 is grounded.

The inverter IV4 includes the transistor TP12 having a source connected to the voltage line V, and the transistor TN12 having a drain connected to the drain of the transistor TP12 at a node N28. The source of the transistor TN12 is grounded.

The clocked inverter CIV1 includes the transistors TP3, TP4, TN3 and TN4. The transistor TP4 has a source connected to the voltage line V, and a drain connected to the source of the transistor TP3. The drain of the transistor TP3 is connected to the drain of the transistor TN4 at a node N23. The source of the transistor TN4 is connected to the drain of the transistor TN3. The source of the transistor TN3 is grounded.

The clocked inverter CIV2 includes the transistors TP5, TP6, TN5 and TN6. The transistor TP6 has a source connected to the voltage line V, and a drain connected to the source of the transistor TP5. The drain of the transistor TP5 is connected to the drain of the transistor TN6 at a node N26. The source of the transistor TN6 is connected to the drain of the transistor TN5. The source of the transistor TN5 is grounded.

The clocked inverter CIV3 includes the transistors TP8, TP9, TN8 and TN9. The transistor TP9 has a source connected to the voltage line V, and a drain connected to the source of the transistor TP8. The drain of the transistor TP8 is connected to the drain of the transistor TN9 at a node N25.

The source of the transistor TN9 is connected to the drain of the transistor TN8. The source of the transistor TN8 is grounded.

The clocked inverter CIV4 includes the transistors TP10, TP11, TN10 and TN11. The transistor TP11 has a source connected to the voltage line V, and a drain connected to the source of the transistor TP10. The drain of the transistor TP10 is connected to the drain of the transistor TN11 at a node N29. The source of the transistor TN11 is connected to the drain of the transistor TN10. The source of the transistor TN10 is grounded.

The gates of the transistors TP2 and TN2 form the input of the inverter IV2. This input of the inverter IV2 is connected to the gate of the transistor TP4 forming the clocked inverter CIV1, the gate of the transistor TN6 forming the clocked inverter CIV2, the gate of the transistor TN8 forming the clocked inverter CIV3, and the gate of the transistor TP10 forming the clocked inverter CIV4.

The output (node N20) of the inverter IV1 is connected to the input of the inverter IV2.

The output (node N21) of the inverter IV2 is connected to the gate of the transistor TN3 forming the clocked inverter CIV1, the gate of the transistor TP5 forming the clocked inverter CIV2, the gate of the transistor TP9 forming the clocked inverter CIV3, and the gate of the transistor TN11 forming the clocked inverter CIV4.

The output (node N27) of the inverter IV3 is connected to the input (gates of the transistors TP6 and TN5) of the clocked inverter CIV2, and the input (gates of the transistors TP8 and TN9) of the clocked inverter CIV3.

The output (node N28) of the inverter IV4 is connected to the input (gates of the transistors TP11 and TN10) of the clocked inverter CIV4, and outputs the signal $BC_k$.

The gates of the transistors TP3 and TN4 forming the clocked inverter CIV1 are connected to the input (gates of the transistors TP12 and TN12) of the inverter IV4.

The output (node N26) of the clocked inverter CIV2 is connected to the output (node N23) of the clocked inverter CIV1, and the input (gates of the transistors TP7 and TN7) of the inverter IV3.

The output (node N25) of the clocked inverter CIV3 is connected to the output (node N29) of the clocked inverter CIV4, and the input (gates of the transistors TP12 and TN12) of the inverter IV4.

<A-6-1. Operation of Unit Frequency Dividing Circuit>

Figure 7:
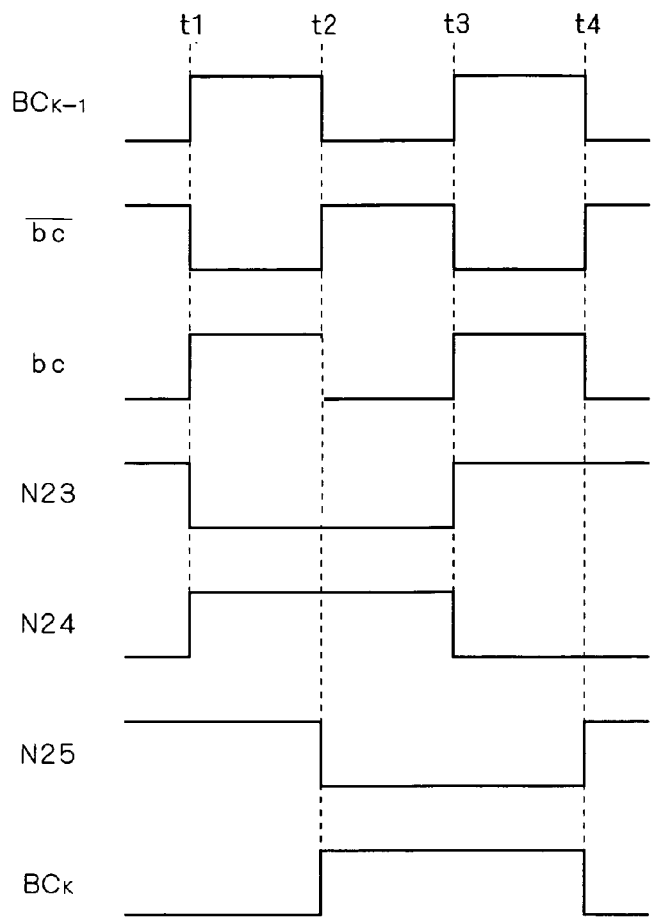
FIG. 7 illustrates waveforms explaining the operation of the unit frequency dividing circuit according to the first preferred embodiment.

FIG. 7 illustrates waveforms explaining the operation of the unit frequency dividing circuit.

A signal bc corresponds to an output signal (voltage level of the node N21) of the inverter IV2, and a signal $\overline{bc}$ corresponds to an output signal (voltage level of the node N20) of the inverter IV1.

The nodes N23 and N25 are initially set to VDD in voltage level by a reset circuit (not shown). In short, the signals $BC_{k-1}$ and $BC_k$ are set to L level in the initial state. As a result, the signals bc and $\overline{bc}$ are at L and H levels, respectively, whereby the clocked inverter CIV1 is in a non-active state.

Then, at time t1, the signal $BC_{k-1}$ changes to an H level, whereby the signals bc and $\overline{bc}$ change to H and L levels, respectively. The clocked inverter CIV1 is thus activated. With the node N25 being set to H level, the node N23 changes to an L level. This causes the node N24 connected to the output (node N27) of the inverter IV3 to change to an H level.

Next, at time t2, the signal $BC_{k-1}$ changes to the L level, whereby the signals bc and $\overline{bc}$ change to the L and H levels, respectively. The clocked inverter CIV1 is thus inactivated, and simultaneously the clocked inverter CIV2 is activated. As a result, the levels of the nodes N23 and N24 remain unchanged and held by a flip-flop circuit formed by the clocked inverter CIV2 and the inverter IV3. Simultaneously, the clocked inverter CIV3 is activated, whereby the node N25 changes to an L level, and the signal $BC_k$ changes to an H level.

Next, at time t3, the signal $BC_{k-1}$ changes to the H level again, whereby the signals bc and $\overline{bc}$ change to the H and L levels, respectively. The clocked inverter CIV1 is thus activated. With the node N25 being at the L level, the node N23 changes to the H level and the node N24 changes to an L level. Simultaneously, the clocked inverter CIV3 is inactivated and the clocked inverter CIV4 is activated. As a result, the levels of the node N25 and the signal $BC_k$ remain unchanged and held by a flip-flop circuit formed by the clocked inverter CIV4 and the inverter IV4.

Then, at time t4, the signal $BC_{k-1}$ changes to the L level again, whereby the signals bc and $\overline{bc}$ change to the L and H levels, respectively. The clocked inverter CIV1 is thus inactivated, and simultaneously the clocked inverter CIV2 is activated. As a result, the levels of the nodes N23 and N24 remain unchanged and held by a flip-flop circuit formed by the clocked inverter CIV2 and the inverter IV3. Simultaneously, the clocked inverter CIV3 is activated, whereby the node N25 changes to the H level, and the signal $BC_k$ changes to the L level.

The operation described above results in the signal $BC_k$ being half the frequency of the signal $BC_{k-1}$, as shown in FIG. 7.

As is shown in FIGS. 2, 3 and 6, the voltage VBC is only connected to four stages of inverters, four stages of clocked inverters, and one stage of level shifter, which constitute comparatively light load to the voltage VBC.

Accordingly, power supply current flowing across VBC and VSS during operation is small. This allows a prescribed voltage to be supplied to the level shifter 60 and the unit frequency dividing circuit even when the charge pump circuit 70 has low efficiency.

<B. Operation of Display Device 100>

The operation of the display device 100 according to the first preferred embodiment will now be described with reference to FIGS. 1 and 2. Upon input of the signal DCLK to the frequency dividing circuit 50 in the power supply circuit 30, the charge pump circuit 70 (see FIG. 2) produces and supplies the voltage VBC to the unit frequency dividing circuit FD1 and the level shifter 60. The signal DCLK is also input to the level shifter 60 that produces the signal DCLKP by converting the H level of the signal DCLK to the voltage VBC and outputs the signal DCLKP to the unit frequency dividing circuit FD1.

The unit frequency dividing circuit FD1 outputs the signal BC1 having a frequency divided to half the signal DCLKP to the unit frequency dividing circuit FD2. The unit frequency dividing circuit FD2 receives the signal BC1, and outputs a signal BC2 having a frequency divided to half the signal BC1. Ultimately, the unit frequency dividing circuit FDn in the last stage outputs the signal $BC_n$ having a frequency divided to $1/2^n$ of the signal BC1 to the charge pump circuit 40 (see FIG. 1) from a terminal 2.

The charge pump circuit 40 receives the signal $BC_n$ to produce and output the voltages VDDH and VSSL to the drive circuit 20.

The drive circuit 20 produces and outputs various kinds of signals for driving the pixel 10. The pixel 10 is driven based on those signals from the drive circuit 20.

<C. Effect>

In the display device 100 according to this preferred embodiment, the voltage VBC higher than the voltage VDD is supplied, among the unit frequency dividing circuits FD1 to FDn forming the frequency dividing circuit 50, to the unit frequency dividing circuit FD1 in the first stage.

This results in an improvement in current driving capability of the TFTs forming the unit frequency dividing circuit FD1 in the first stage. Though being supplied with the signal DCLKP of the highest frequency, the unit frequency dividing circuit FD1 in the first stage with improved current driving capability attains a widened operating margin.

The improvement in current driving capability of the unit frequency dividing circuit in the first stage allows improvements in operating margin of the frequency dividing circuit 50, and also of the power supply circuit 30 and the display device 100 including the circuit 50.

While being supplied only to the unit frequency dividing circuit FD1 in this preferred embodiment, the voltage VBC may be supplied to the other unit frequency dividing circuits as well. When the signal DCLKP has a high frequency that may cause a limited operating margin of the unit frequency dividing circuit FD2, the voltage VBC should be supplied to the unit frequency dividing circuit FD2 as well to widen the operating margin.

The pixel 10 may be a liquid crystal element, or an electro-luminescence element such as organic EL.

<D. Modification>

The level shifter 60 is not an absolute necessity for the circuit 80 in the frequency dividing circuit 50. Flow-through current will not flow through the unit frequency dividing circuit FD1 when the booster voltages VBC, VDD and a threshold voltage VTP of the P-type TFTs satisfy the following condition:

VBC−VDD<|VTP|

Figure 8:
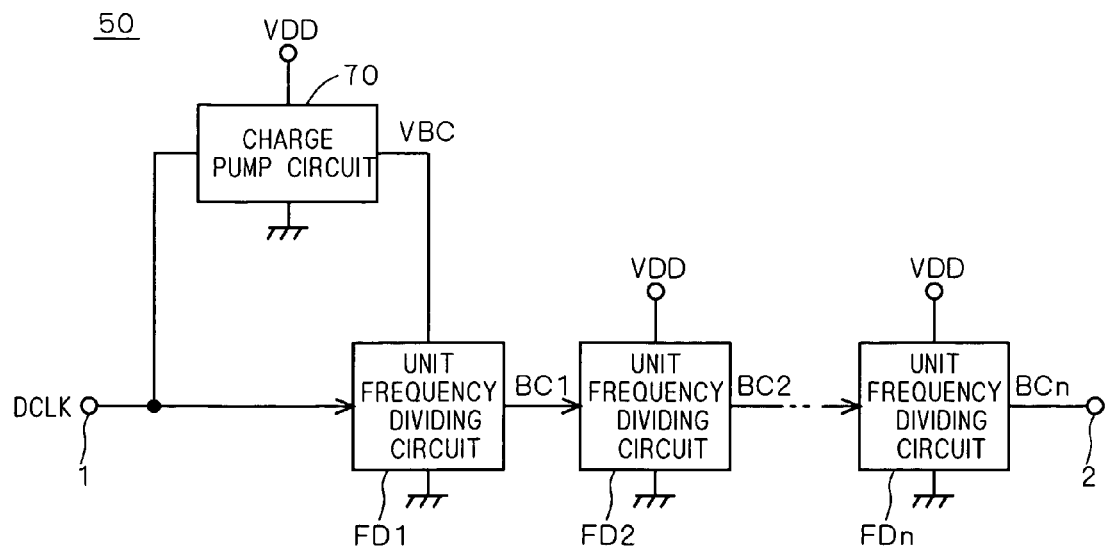
FIG. 8 is a block diagram illustrating a modified structure of the frequency dividing circuit according to the first preferred embodiment.

Accordingly, the level shifter 60 may be done away with as shown in FIG. 8. This results in a simplified structure of the frequency dividing circuit 50.

Second Preferred Embodiment

<A. Structure of Charge Pump Circuit 70>

Figure 9:
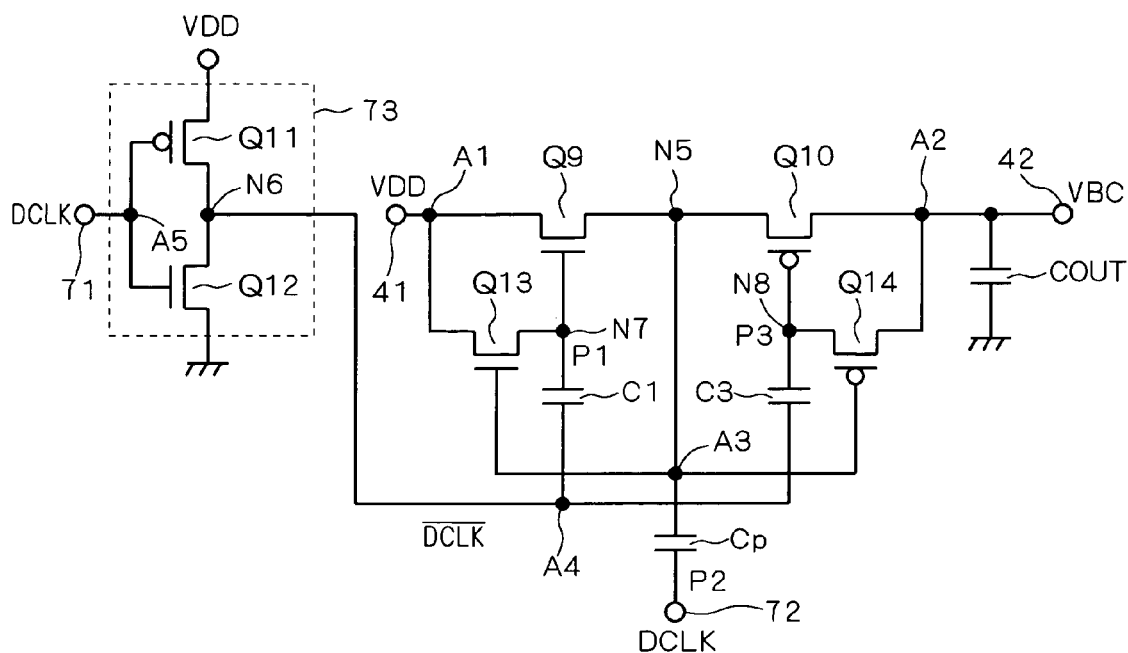
FIG. 9 is a circuit diagram illustrating the structure of a charge pump circuit according to a second preferred embodiment of the present invention.

FIG. 9 is a circuit diagram illustrating the structure of the charge pump circuit 70 according to a second preferred embodiment of the present invention. The corresponding parts to those in the first preferred embodiment are referred to by the same reference numerals to omit redundant descriptions.

A node N7 corresponds to the signal p1 shown in FIG. 4 in voltage level, and a node N8 to the signal P3 in voltage level. The signal P2 is supplied by the dot clock signal DCLK.

In the charge pump circuit 70 shown in FIG. 9, an inverter 73 inverts the signal DCLK to produce the inversion signal $\overline{DCLK}$ for producing the signals p1 and P3.

In FIG. 9, transistors Q9, Q12 and Q13 are N-type TFTs, and transistors Q10, Q11 and Q14 are P-type TFTs.

The transistor Q10 (second transistor) has a drain (other side terminal) connected to the output terminal 42 and one end of the output capacitance COUT (second capacitance element). The other end of the output capacitance COUT is grounded. The voltage VBC is output from the output terminal 42.

The transistor Q10 has a source (one side terminal) connected to the source (other side terminal) of the transistor Q9 (first transistor) at the node N5. The drain (one side terminal)

of the transistor Q9 is connected to the input terminal 41. The node N5 is connected to one end of the capacitance Cp (first capacitance element). The signal P2 is input to the other end of the capacitance Cp.

The transistor Q14 (fourth transistor) is interposed between the gate (control terminal) and drain of the transistor Q10. In short, the transistor Q14 has a drain (one side terminal) connected to the drain of the transistor Q10 at a node A2, and a source (other side terminal) connected to the gate of the transistor Q10 at the node N8.

The transistor Q13 (third transistor) is interposed between the gate (control terminal) and drain of the transistor Q9. In short, the transistor Q13 has a drain (one side terminal) connected to the drain of the transistor Q9 at a node A1, and a source (other side terminal) connected to the gate of the transistor Q9 at the node N7.

The gates of the transistors Q13 and Q14 are connected to the one end of the capacitance Cp at a node A3. The other end of the capacitance Cp is connected to a terminal 72, and is supplied with the signal DCLK.

The gate of the transistor Ql0 is connected to one end of capacitance C3 (fourth capacitance element). The gate of the transistor Q9 is connected to one end of capacitance C1 (third capacitance element). The other end of the capacitance C1 is connected to the other end of the capacitance C3 at a node A4.

The transistor Q11 has a source supplied with the voltage VDD, and a drain connected to the drain of the transistor Q12 at a node N6. The source of the transistor Q12 is grounded. The node N6 is connected to the node A4.

The gates of the transistors Q11 and Q12 are connected at a node A5 that is connected to an input terminal 71. The transistors Q11 and Q12 form the inverter 73. The terminals 71 and 72 are supplied with the signal DCLK, namely, are connected to the terminal 1 (see FIG. 2).

<B. Operation of Charge Pump Circuit 70>

Figure 10:
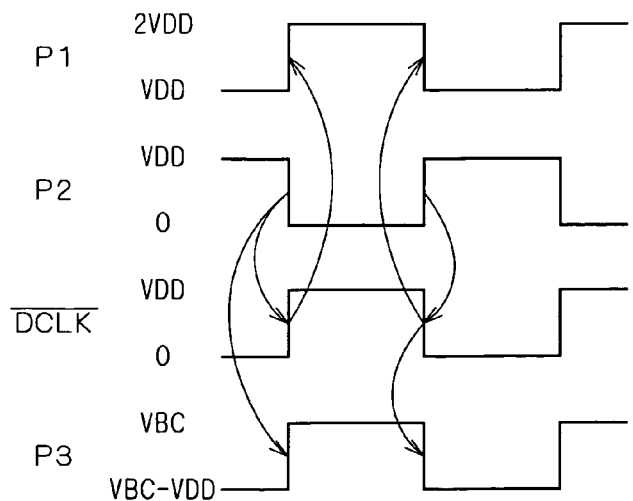
FIG. 10 illustrates waveforms explaining the operation of the charge pump circuit according to the second preferred embodiment.

FIG. 10 illustrates waveforms explaining the operation of the charge pump circuit 70 according to the second preferred embodiment.

Upon application of the voltage VDD, the input of the dot clock signal DCLK of several cycles causes the signal p1 (node N7) to be charged to VDD in voltage level. The inversion signal $\overline{DCLK}$ changes to an H level (VDD) in such state, causing the signal p1 to become 2·VDD in voltage level by the coupling to the capacitance element C1.

The transistor Q9 changes to the ON state, whereby current flows from the terminal 41 to the capacitance Cp thus charging the capacitance Cp. At this time, the signal P2 (DCLK) is at an L level, the capacitance Cp is charged up to VDD, and the node N5 becomes VDD in voltage level.

The signal P2 then changes to an H level, whereby the node N5 becomes 2·VDD in voltage level by capacitive coupling.

It is to be noted that at this time, due to a change to an L level of the inversion signal $\overline{DCLK}$, the signal p1 is in the process of dropping to VDD in voltage level. Accordingly, the transistor Q9 is not completely turned off. This causes current to flow backward from the node N5 via the transistor Q9, resulting in a reduction in charging efficiency.

Simultaneously, due to the change to the L level of the inversion signal $\overline{DCLK}$, the signal P3 (node N8) drops in voltage level by the coupling to the capacitance C3, from the voltage VBC by VDD that corresponds to amplitude of the inversion signal $\overline{DCLK}$. As a result, the transistor Q10 changes to the ON state, causing current to flow from the node N5 via the transistor Q10 thus charging the output capacitance COUT up to a prescribed value.

The signal P2 changes to the L level, causing the node N5 to drop in voltage level, and simultaneously the transistor Q14 changes to the ON state, causing the signal P3 to become VBC in voltage level. The transistor Q10 is then turned off during which current flows backward from the terminal 42 to the node N5, resulting in a reduction in charging efficiency.

By repeating the operation described above, the voltage VBC rises higher than VDD.

<C. Effect of Charge Pump Circuit 70>

The charge pump circuit 70 according to the first preferred embodiment (see FIG. 4) is required to produce the signals P1 and P3 being at a voltage of 2·VDD on their H levels from the signal DCLK being at a voltage of VDD on its H level, and further needs to be controlled with the intervals of times dt1 to dt4.

Meanwhile, the charge pump circuit 70 according to the second preferred embodiment only receives the signal DCLK, and needs no time intervals. The frequency dividing circuit according to this preferred embodiment is therefore fabricated more easily.

Third Preferred Embodiment

<A. Structure of Frequency Dividing Circuit 50>

Figure 11:
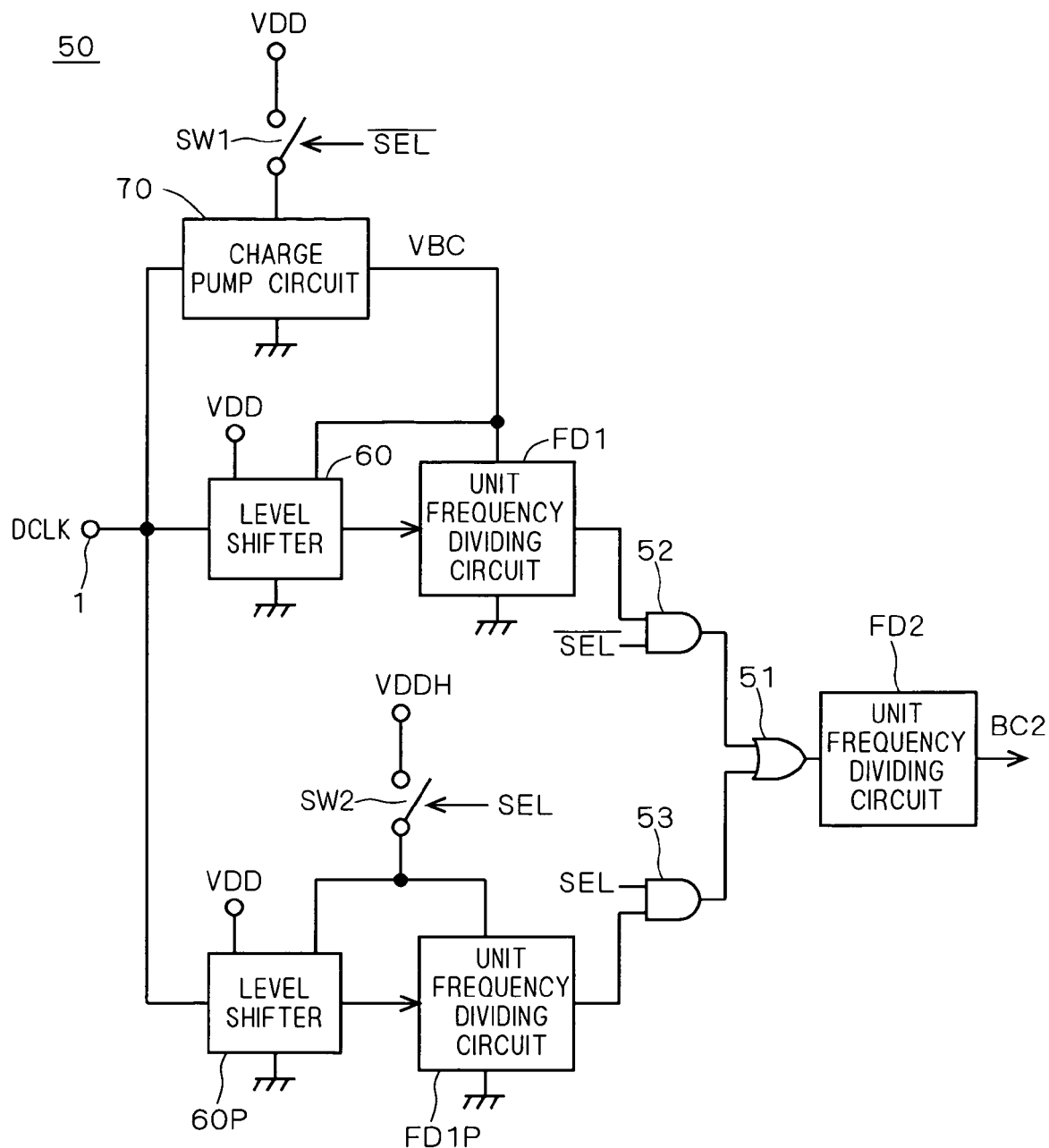
FIG. 11 is a block diagram illustrating the structure of a frequency dividing circuit according to a third preferred embodiment of the present invention.

FIG. 11 is a block diagram illustrating the structure the frequency dividing circuit 50 according to a third preferred embodiment of the present invention. The corresponding parts to those in the first preferred embodiment are referred to by the same reference numerals to omit redundant descriptions.

The frequency dividing circuit 50 according to this preferred embodiment is equivalent to the frequency dividing circuit 50 according to the first preferred embodiment (see FIG. 2) that further includes a unit frequency dividing circuit FD1P (second unit frequency dividing circuit) and a level shifter 60P (second level shifter). The unit frequency dividing circuit FD1P and the level shifter 60P are structured in a similar fashion as the unit frequency dividing circuit FD1 (first unit frequency dividing circuit) and the level shifter 60, respectively.

The input of the unit frequency dividing circuit FD2 is connected to the output of an OR circuit 51. The OR circuit 51 has one input connected to the output of an AND circuit 52, and the other input connected to the output of an AND circuit 53. The AND circuit 52 has one input supplied with a signal $\overline{SEL}$, and the other input connected to the output of the unit frequency dividing circuit FD1.

The input of the unit frequency dividing circuit FD1 is connected to the output of the level shifter 60. The input of the level shifter 60 is connected to the input terminal 1.

In addition, the level shifter 60 and the unit frequency dividing circuit FD1 are connected to the output of the charge pump circuit 70, and are supplied with the voltage VBC (booster voltage). The level shifter 60 is further supplied with the voltage VDD.

The charge pump circuit 70 is connected to the voltage VDD via a switch SW1. The turning-on/off of the switch SW1 is controlled by the signal $\overline{SEL}$. The input of the charge pump circuit 70 is connected to the terminal 1.

The AND circuit 53 has one input supplied with a signal SEL, and the other input connected to the output of the unit frequency dividing circuit FD1P. The input of the unit frequency dividing circuit FD1P is connected to the output of the level shifter 60P. The input of the level shifter 60P is connected to the terminal 1.

In addition, the unit frequency dividing circuit FD1P and the level shifter 60P are supplied with the voltage VDDH (output voltage of the charge pump circuit 40 (see FIG. 1): second booster voltage) via a switch SW2. The turning-on/off of the switch SW2 is controlled by the signal SEL.

<B. Operation of Frequency Dividing Circuit 50>

Figure 12:
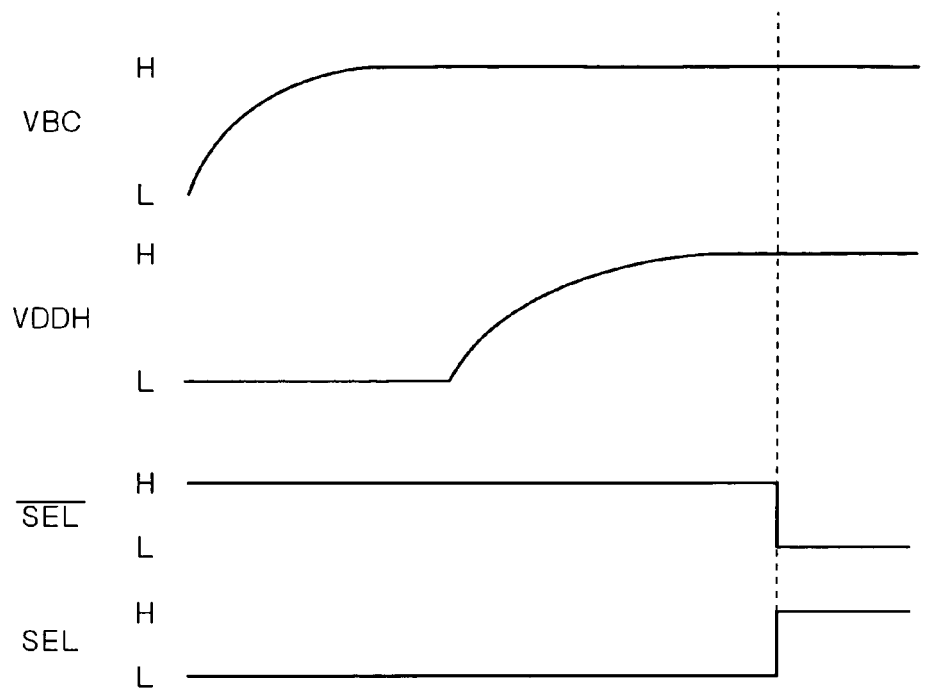
FIG. 12 illustrates waveforms explaining the operation of the frequency dividing circuit according to the third preferred embodiment.

FIG. 12 illustrates waveforms explaining the operation of the frequency dividing circuit 50 according to the third preferred embodiment. In this circuit 50, the operation switching between the unit frequency dividing circuits FD1 and FD1P is done by the switches SW1 and SW2, and the output switching is done by the AND circuits 52, 53 and the OR circuit 51.

Initially, the signal SEL is set to L level and the signal $\overline{\text{SEL}}$ is set to H level. The switch SW1 is thus turned on, whereby the voltage VDD is supplied to the charge pump circuit 70, activating the level shifter 60 and the unit frequency dividing circuit FD1.

Meanwhile, the switch SW2 is in the OFF state, so the level shifter 60P and the unit frequency dividing circuit FD1P do not operate due to the unsupplied voltage VDDH.

With the signal SEL being set to L level and the signal $\overline{\text{SEL}}$ to H level, the output of the unit frequency dividing circuit FD1 is input to the unit frequency dividing circuit FD2 via the AND circuit 52 and the OR circuit 51.

The unit frequency dividing circuit FD1 is driven by the voltage VBC. The signal $BC_n$ is output from the frequency dividing circuit 50 to the charge pump circuit 40 (see FIG. 1). The charge pump circuit 40 then produces the voltage VDDH.

When the voltage VDDH becomes higher than a prescribed level (time indicated by a dashed line in FIG. 12), the signal SEL changes to an H level and the signal $\overline{\text{SEL}}$ changes to an L level. The switch SW1 is thus turned off, whereby the charge pump circuit 70 is cut off from the voltage VDD, suspending the operations of the level shifter 60 and the unit frequency dividing circuit FD1. Meanwhile, the switch SW2 is turned on, whereby the voltage VDDH is supplied to the level shifter 60P and the unit frequency dividing circuit FD1P which start operating.

With the signal SEL being set to H level and the signal $\overline{\text{SEL}}$ to L level, the output of the unit frequency dividing circuit FD1P is input to the unit frequency dividing circuit FD2 via the AND circuit 53 and the OR circuit 51. The switch SW2 is not an absolute necessity, or alternatively, the switch SW2 may be connected all the time.

<C. Operation of Frequency Dividing Circuit 50>

In the frequency dividing circuit 50 according to this preferred embodiment, the inefficient charge pump circuit 70 is only used upon activation of the power supply circuit 30, and when the output of the power supply circuit 30, namely, the output voltage VDDH of the charge pump circuit 40 becomes higher than the prescribed level, the unit frequency dividing circuit FD1P is driven by using the voltage VDDH.

That is, the switching between the unit frequency dividing circuit FD1 which is supplied with the voltage VBC and the unit frequency dividing circuit FD1P which is supplied with the voltage VDDH is done based on whether the voltage VDDH becomes higher than the prescribed level (prescribed value).

Consequently, the use of the frequency dividing circuit 50 according to this preferred embodiment attains improved efficiency of the power supply circuit 30 as a whole.

The frequency dividing circuit 50 according to this preferred embodiment only has the unit frequency dividing circuits FD1 and FD1P in the first stage provided therein. Alternatively, two sets of unit frequency dividing circuits each of which is cascade-connected from first to third stages may be provided and switched based on whether the voltage VDDH becomes higher than the prescribed level.

As has been discussed in the first preferred embodiment, the level shifter 60P may be done away with by satisfying the condition of VDDH−VDD<|VTP| where flow-through current will not flow through the unit frequency dividing circuit FD1.

Fourth Preferred Embodiment

<A. Structure of Frequency Dividing Circuit 50>

Figure 13:
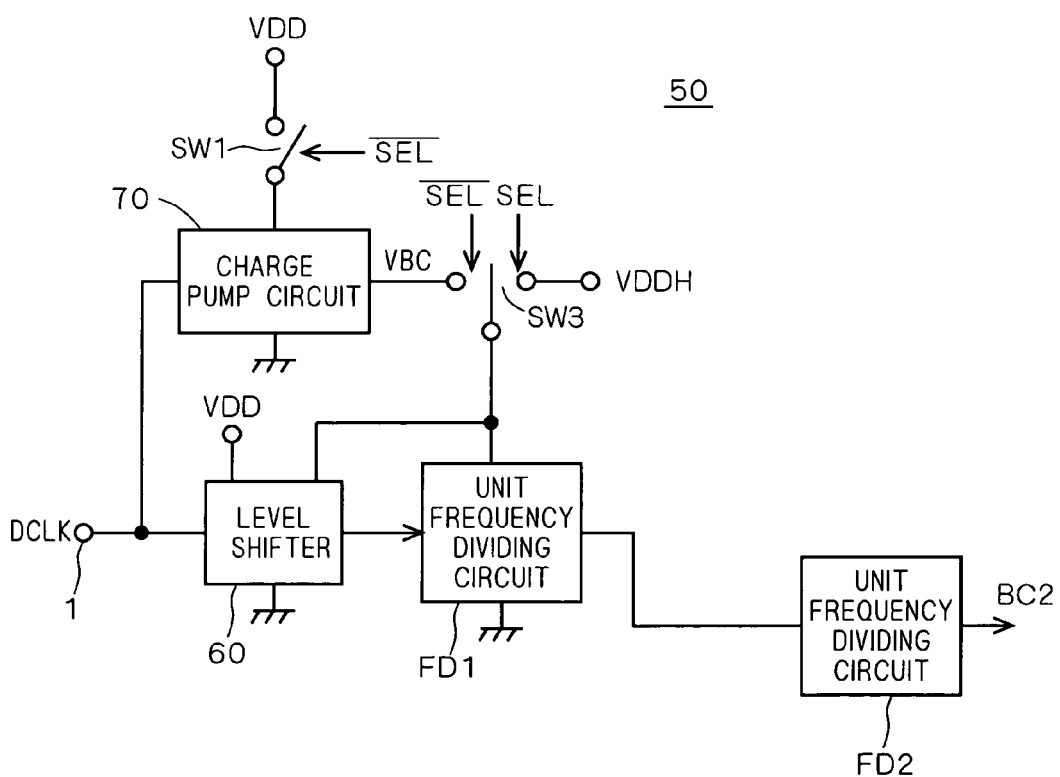
FIG. 13 is a block diagram illustrating the structure of a frequency dividing circuit according to a fourth preferred embodiment of the present invention.

FIG. 13 is a block diagram illustrating the structure of the frequency dividing circuit 50 according to a fourth preferred embodiment of the present invention. The corresponding parts to those in FIG. 11 are referred to by the same reference numerals to omit redundant descriptions.

The frequency dividing circuit 50 according to this preferred embodiment is equivalent to the frequency dividing circuit 50 shown in FIG. 11 with the omission of the level shifter 60P and the unit frequency dividing circuit FD1P.

The unit frequency dividing circuit FD1 and the level shifter 60 are connected via a switch SW3 to the output of the charge pump circuit 70, or the voltage VDDH.

<B. Operation of Frequency Dividing Circuit 50>

The switch SW3 is controlled by the signals SEL and $\overline{\text{SEL}}$, and when the signal SEL is set to H level and the signal $\overline{\text{SEL}}$ to L level, supplies the voltage VDDH to the level shifter 60 and the unit frequency dividing circuit FD1.

On the other hand, when the signal $\overline{\text{SEL}}$ is set to H level and the signal SEL to L level, the switch SW3 supplies the voltage VBC from the charge pump circuit 70 to the level shifter 60 and the unit frequency dividing circuit FD1.

<C. Operation of Frequency Dividing Circuit 50>

Again in this preferred embodiment, the inefficient charge pump circuit 70 is only used upon activation of the power supply circuit 30. This results in improved efficiency of the power supply circuit 30 as a whole.

Moreover, the omission of the level shifter 60P and the unit frequency dividing circuit FD1P results in a simplified structure.

Fifth Preferred Embodiment

Figure 14:
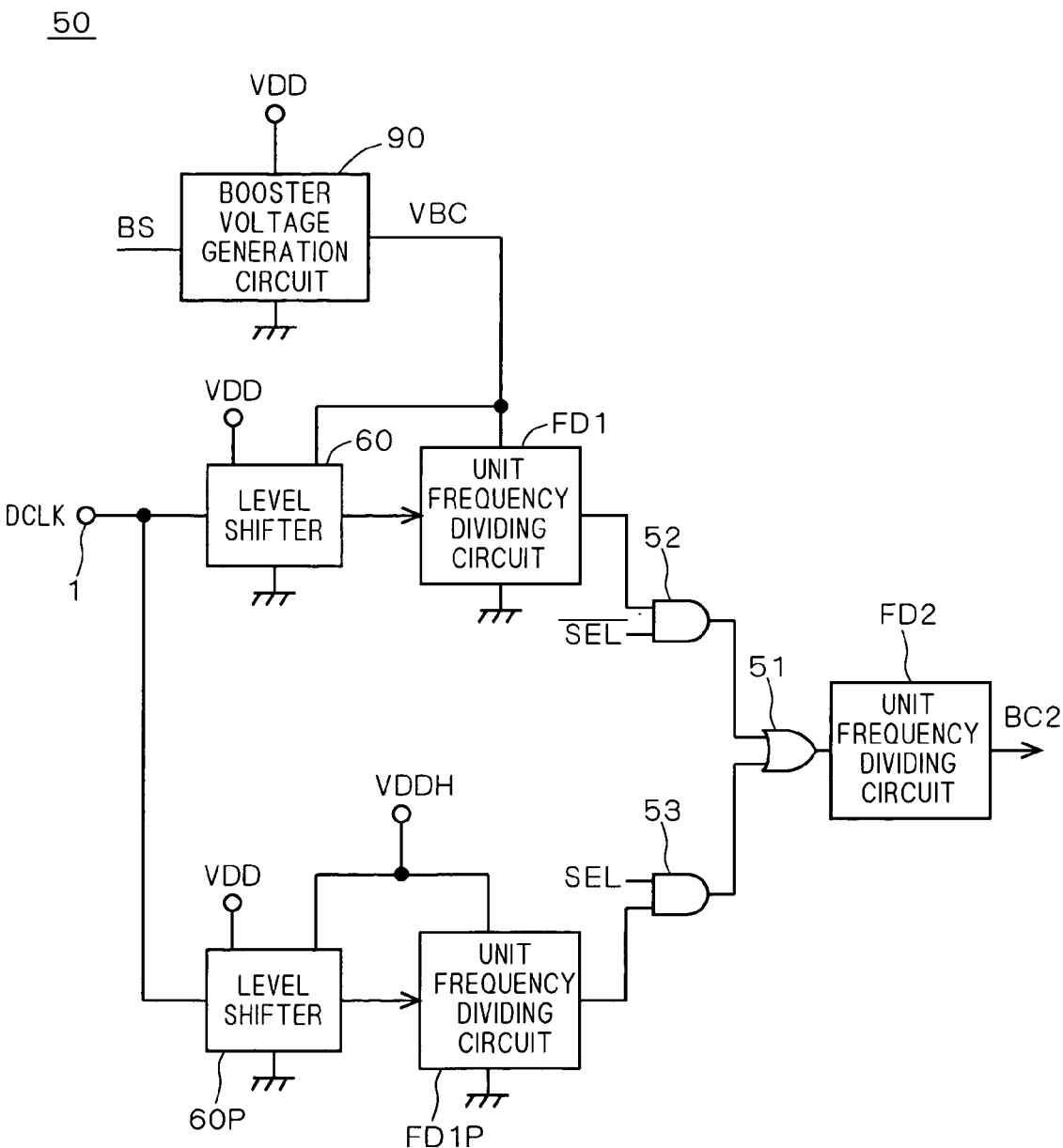
FIG. 14 is a block diagram illustrating the structure of a frequency dividing circuit according to a fifth preferred embodiment of the present invention.

FIG. 14 is a block diagram illustrating the structure of the frequency dividing circuit 50 according to a fifth preferred embodiment of the present invention. The frequency dividing circuit 50 according to this preferred embodiment is equivalent to the frequency dividing circuit 50 according to the third preferred embodiment (see FIG. 11) with the charge pump circuit 70 being replaced by a booster voltage generation circuit 90.

The corresponding parts to those in the third preferred embodiment are referred to by the same reference numerals to omit redundant descriptions.

<A. Structure of Booster Voltage Generation Circuit 90>

Figure 15:
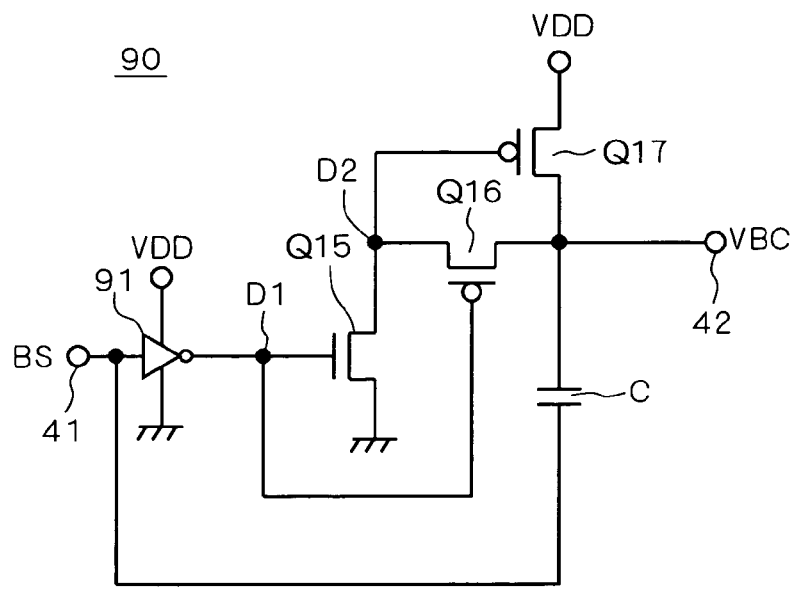
FIG. 15 is a circuit diagram illustrating the structure of a booster voltage generation circuit according to the fifth preferred embodiment.

FIG. 15 is a circuit diagram illustrating the structure of the booster voltage generation circuit 90. In FIG. 15, a transistor Q15 is an N-type transistor, and transistors Q16 and Q17 are P-type transistors.

The transistor Q17 (first transistor) has a source (one side terminal) supplied with the voltage VDD, and a drain (other side terminal) connected to the terminal 42 and capacitance C (capacitance element). The other end of the capacitance C is connected to the input of an inverter 91.

The gate (control terminal) of the transistor Q17 is connected to the drain (one side terminal) of the transistor Q15 (second transistor) at a node D2. The source (other side terminal) of the transistor Q15 is grounded. The input of the inverter 91 is connected to the terminal 41. The gate of the transistor Q15 is connected to the output of the inverter 91. The inverter 91 is supplied with the voltage VDD.

The transistor Q16 (third transistor) is interposed between the gate and drain of the transistor Q17. The transistor Q16 has a drain (one side terminal) connected to the gate of the transistor Q17 at the node D2, and a source (other side terminal) connected to the drain of the transistor Q17. A signal BS is input to the input of the inverter 91, and the voltage VBC is output from the terminal 42.

<B. Operation of Booster Voltage Generation Circuit 90>

Figure 16:
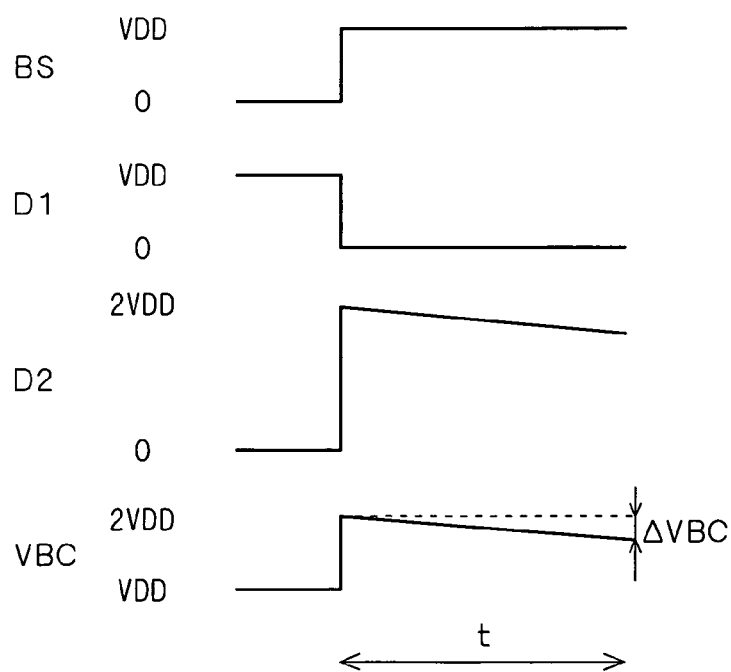
FIG. 16 illustrates waveforms explaining the operation of the booster voltage generation circuit according to the fifth preferred embodiment.

FIG. 16 illustrates waveforms explaining the operation of the booster voltage generation circuit 90.

When the signal BS is at an L level (0 V), the output of the inverter 91 (voltage level of a node D1) is at an H level. As a result, the transistor Q15 changes to the ON state, and the transistor Q16 changes to the OFF state.

Following the transistor Q15's change to the ON state, the node D2 changes to an L level in voltage. This causes the transistor Q17 to change to the ON state, whereby the voltage VBC becomes VDD. Simultaneously, current flows from the voltage VDD via the transistor Q17, thus charging the capacitance C up to VDD.

Next, the value of the booster capacitance C is increased a lot higher than the load capacitance connected to the terminal 42, to raise the signal BS from the L level (0 V) to an H level (VDD). As a result, the voltage VBC becomes almost 2·VDD by capacitive coupling.

Following the signal BS's change to the H level, the node D1 changes to an L level in voltage. As a result, the transistor Q15 changes to the OFF state, and the transistor Q16 changes to the ON state.

Consequently, almost simultaneously with the rise in the voltage VBC, the node D2 follows it and rises itself via the transistor Q16, to become 2·VDD in voltage.

Accordingly, the transistor Q17 comes close to 0 in voltage across its gate and source, and changes to the OFF state. This prevents a voltage level reduction of the voltage VBC resulting from backward current from the output terminal 42 via the transistor Q17 due to the rise to 2·VDD of the voltage VBC.

After the rise to 2·VDD of the voltage VBC, the capacitance C acts as output voltage holding capacitance. Electric charge accumulated in the capacitance C is gradually decreased afterward by the load current from the output terminal 42. At this time, a booster capacitance value with respect to the load current is determined in such a manner as to ensure a time period over which a desired voltage VDDH is generated.

For example, assuming that a value CV of the capacitance C=1 µF, a load current IL=100 µA, and an allowable voltage drop of the voltage VBC=2 V, a time period t over which the voltage VBC drops to an allowable value ΔV is given by the following expression:

$$t = CV \cdot \Delta VBC / IL$$
$$= 1 \times 10^{-6} \times 2 / 100 \times 10^{-6}$$
$$= 20 \text{ (ms)}$$

Therefore, the voltage VDDH should be raised to a prescribed level by a charge pump operation over a period of 20 ms. It is easy under normal conditions to raise the voltage VDDH to a prescribed level within as long as 20 ms.

<C. Effect of Booster Voltage Generation Circuit 90>

In the frequency dividing circuit 50 according to this preferred embodiment, the charge pump circuit 70 is replaced by the booster voltage generation circuit 90. The booster voltage generation circuit 90 may be used with high energy efficiency as to the voltage generation over a fixed time period as described above. Consequently, a frequency dividing circuit of high energy efficiency is attained.

<D. Modification to Booster Voltage Generation Circuit 90>

Figure 17:
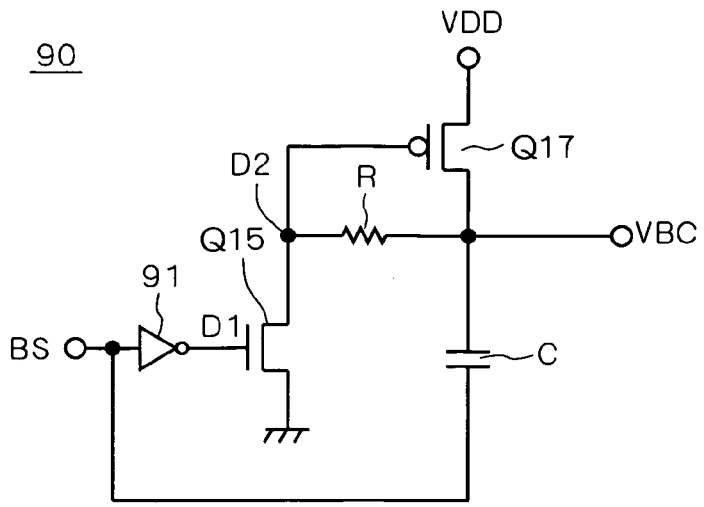
FIG. 17 is a circuit diagram illustrating a modified structure of the booster voltage generation circuit according to the fifth preferred embodiment.

FIG. 17 is a circuit diagram illustrating a modification to the booster voltage generation circuit 90. In this modification, a resistor R (resistance element) is interposed instead of the transistor Q16 between the gate and drain of the transistor 17. Namely, the resistor R has one side terminal connected to the gate of the transistor Q17, and the other side terminal connected to the drain of the transistor Q17. The resistor R is set to have a value a lot higher than an ON resistance value of the transistor Q15.

The use of the resistor R instead of the transistor Q16 makes it easier to form the booster voltage generation circuit 90.

Sixth Preferred Embodiment

<A. Structure of Booster Voltage Generation Circuit 90>

Figure 18:
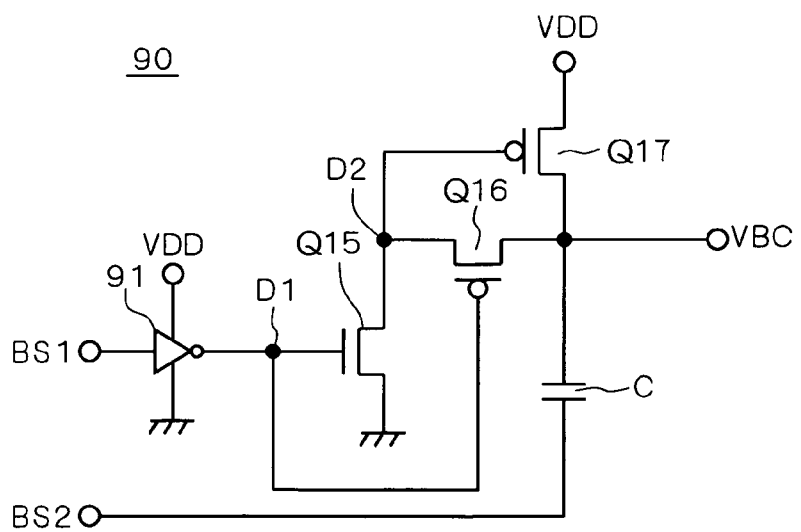
FIG. 18 is a circuit diagram illustrating the structure of a booster voltage generation circuit according to a sixth preferred embodiment of the present invention.

FIG. 18 is a circuit diagram illustrating the structure of the booster voltage generation circuit 90 according to a sixth preferred embodiment of the present invention. In this circuit 90, a signal BS1 is input to the input of the inverter 91, and a signal BS2 is input to the other end of the capacitance C.

The corresponding parts to those in FIG. 15 are referred to by the same reference numerals to omit redundant descriptions.

<B. Operation of Booster Voltage Generation Circuit 90>

Figure 19:
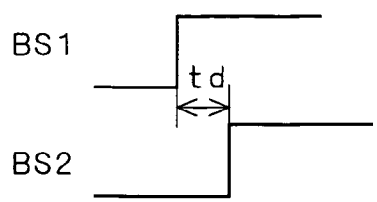
FIG. 19 illustrates waveforms of signals input to the booster voltage generation circuit according to the sixth preferred embodiment.

FIG. 19 illustrates waveforms of the signals BS1 and BS2. The signal BS1 first changes from an L level to an H level, and after a lapse of time td thereafter, the signal BS2 changes to an L level to an H level.

First, upon input of the signal BS1 of L level, an H level signal is input to the gate of the transistor Q15 via the inverter 91, whereby the transistor Q15 changes from the OFF state to the ON state. The gate of the transistor Q17 is then grounded via the transistor Q15 now being in the ON state, whereby the transistor Q17 changes from the OFF state to the ON state. This causes current to flow from the voltage VDD to the capacitance C via the transistor Q17 now being in the ON state, thus charging the capacitance C up to VDD.

Next, upon change in the signal BS1 from the L level to the H level, an L level signal is input to the gate of the transistor Q15 via the inverter 91, whereby the transistor Q15 changes from the ON state to the OFF state, and the transistor Q16 changes from the OFF state to the ON state. Following the transistor Q16's change to the ON state, the transistor Q17 becomes equal in voltage across its gate and source, and changes to the OFF state.

Then, after a lapse of time td following the signal BS1's change from the L level to the H level, the signal BS2 changes from the L level to the H level. As a result, with the capacitance C being charged up to VDD, the voltage VBC of 2·VDD is output.

<C. Effect of Booster Voltage Generation Circuit 90>

In the booster voltage generation circuit 90 according to the fifth preferred embodiment, the boosting by the capacitance C may be done prior to the transistor Q16's change to the ON state.

In such case, booster current flows from the capacitance C via the transistor Q17 that is in the ON state until after the transistor Q16 changes to the ON state, resulting in a loss in boosting the voltage VBC.

Meanwhile, in the booster voltage generation circuit 90 according to this preferred embodiment, the signal BS2 changes from the L level to the H level so that the boosting is done by the capacitance C after the transistor Q17 completely changes to the OFF state. This prevents a loss in boosting the voltage VBC resulting from booster current flowing from the capacitance C via the transistor Q17.

<D. First Modification to Booster Voltage Generation Circuit 90>

<D-1. Structure>

Figure 20:
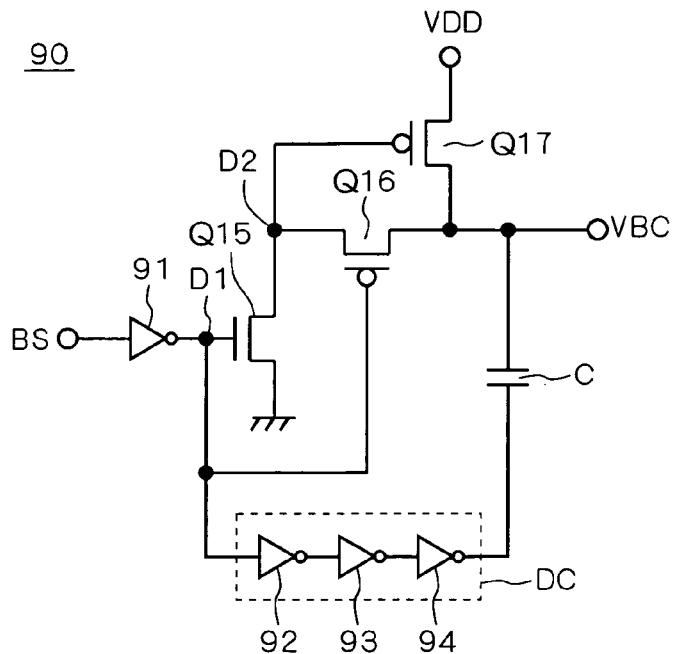
FIG. 20 is a circuit diagram illustrating a first modified structure of the booster voltage generation circuit according to the sixth preferred embodiment.

FIG. 20 is a circuit diagram illustrating a first modification to the booster voltage generation circuit 90 according to the sixth preferred embodiment. In this circuit 90, a delay circuit DC is connected to the other end of the capacitance C. The input of the delay circuit DC is connected to the output of the inverter 91 at the node D1. The gate of the transistor Q16 is connected to the input of the delay circuit DC.

The delay circuit DC includes odd-numbered (three in the FIG. 20 example) cascade-connected inverters 92 to 94.

<D-2. Operation>

Upon input of the signal BS of L level, the transistor Q15 changes to the ON state, whereby the transistor Q17 changes to the ON state, thus charging the capacitance C up to VDD.

Then, upon change in the signal BS from the L level to the H level, the transistor Q15 changes to the OFF state, and the transistor Q16 changes to the ON state.

After a lapse of a fixed time period, an H level signal is input to the capacitance C via the delay circuit DC, thus boosting the voltage VBC.

<D-3. Effect>

The provision of the delay circuit DC in this modification allows the boosting by the capacitance C to be done after the transistor Q16 changes to the ON state.

This prevents a boosting loss resulting from booster current flowing from the capacitance C to the voltage VDD via the transistor 17.

Further in this modification, a booster voltage generation circuit with no boosting loss is attained only by the single signal BS, without preparing the two signals BS1 and BS2 and controlling by providing the time td.

<E. Second Modification to Booster Voltage Generation Circuit 90>

<E-1. Structure>

Figure 21:
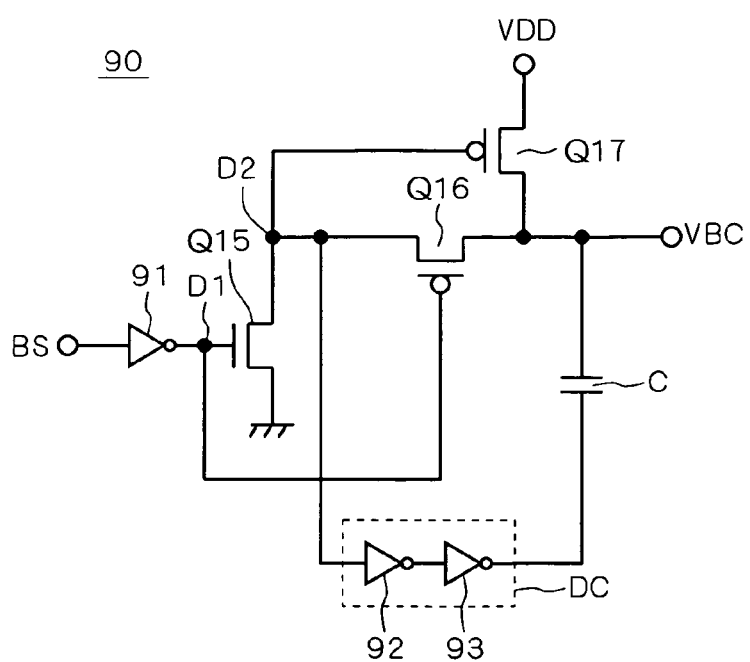
FIG. 21 is a circuit diagram illustrating a second modified structure of the booster voltage generation circuit according to the sixth preferred embodiment.

FIG. 21 is a circuit diagram illustrating a second modification to the booster voltage generation circuit 90. In this circuit 90, the delay circuit DC is connected to the other end of the capacitance C. The input of the delay circuit DC is connected to the drain of the transistor Q16. The gate of the transistor Q16 is connected to the input of the inverter 91 at the node D1.

The delay circuit DC includes even-numbered (two in the FIG. 21 example) cascade-connected inverters 92 and 93.

<E-2. Operation>

Upon input of the signal BS of L level, the transistor Q15 changes to the ON state, whereby the transistor Q17 changes to the ON state, thus charging the capacitance C up to VDD.

Then, upon change in the signal BS to the H level, the transistor Q15 changes to the OFF state, and the transistor Q16 changes to the ON state.

Following the transistor Q16's change to the ON state, the transistor Q17 becomes equal in voltage across its gate and source, and changes to the OFF state.

The transistor Q17 then changes to the ON state, whereby the node D2 rises to an H level (VDD) in voltage, causing an H level signal to be input to the capacitance C via the delay circuit DC. As a result, the voltage VBC rises to 2·VDD and is output.

<E-3. Effect>

In this modification, the boosting by the capacitance C is done after a lapse of a fixed time period by the delay circuit DC following the transistor Q16's change to the ON state. This prevents a boosting loss resulting from booster current flowing from the capacitance C to the voltage VDD via the transistor Q17.

Seventh Preferred Embodiment

Figure 22:
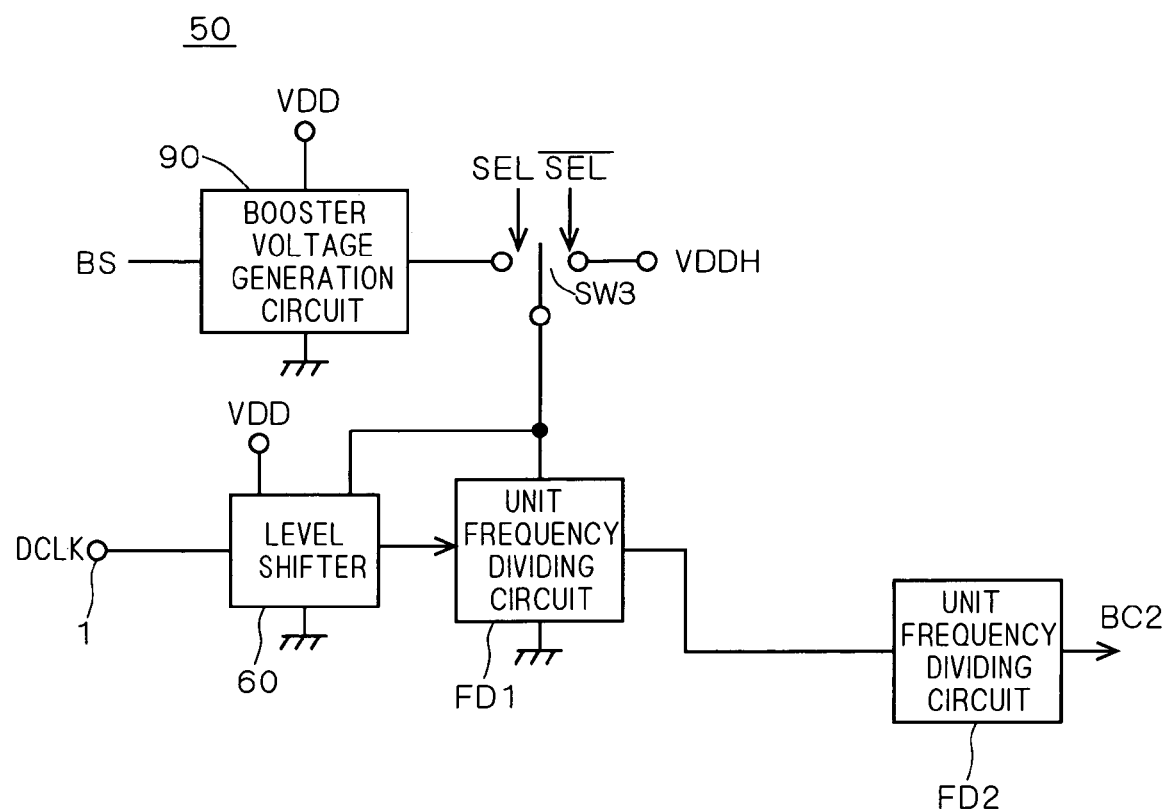
FIG. 22 is a block diagram illustrating the structure of a frequency dividing circuit according to a seventh preferred embodiment of the present invention.

FIG. 22 is a block diagram illustrating the structure of the frequency dividing circuit 50according to a seventh preferred embodiment of the present invention.

The frequency dividing circuit 50 according to this preferred embodiment is equivalent to the frequency dividing circuit 50 according to the fourth preferred embodiment (see FIG. 13) with the charge pump circuit 70 being replaced by the booster voltage generation circuit 90.

The corresponding parts to those in the fourth preferred embodiment are referred to by the same reference numerals to omit redundant descriptions.

The frequency dividing circuit 50 according to this preferred embodiment attains higher energy efficiency than the circuit 50 according to the fourth preferred embodiment by using the booster voltage generation circuit 90 of high energy efficiency instead of the charge pump circuit 70. This results in improved efficiency of the power supply circuit 30 as a whole.

While the invention has been shown and described in detail, the foregoing description is in all aspects illustrative and not restrictive. It is therefore understood that numerous modifications and variations can be devised without departing from the scope of the invention.

What is claimed is:

1. A frequency dividing circuit dividing and outputting the frequency of an input signal, said frequency dividing circuit comprising:
   a plurality of cascade-connected unit frequency dividing circuits; and
   an input circuit receiving said input signal and a voltage and outputting a signal related to said input signal to a first stage of said plurality of cascade-connected unit frequency dividing circuits, said input circuit including a booster circuit supplying a booster voltage to at least said first stage of said plurality of cascade-connected unit frequency dividing circuits, wherein at least one of said plurality of unit frequency dividing circuits other than said first stage of said plurality of unit frequency dividing circuits is supplied with a power supply voltage less than the booster voltage.

2. The frequency dividing circuit according to claim 1, wherein said booster circuit comprises:
   a first transistor having a first side terminal supplied with an input voltage;
   a first capacitance element having one end connected to a second side terminal of said first transistor;

a second transistor having a first side terminal connected to said one end of said first capacitance element; and a second capacitance element having one end connected to a second side terminal of said second transistor.

3. The frequency dividing circuit according to claim 2, wherein said booster circuit further comprises:

a third transistor having a first side terminal connected to said first side terminal of said first transistor, a second side terminal connected to a control terminal of said first transistor, and a control terminal connected to said one end of said first capacitance element;

a fourth transistor having a first side terminal connected to said second side terminal of said second transistor, a second side terminal connected to a control terminal of said second transistor, and a control terminal connected to said one end of said first capacitance element;

a third capacitance element having one end connected to said control terminal of said first transistor; and a fourth capacitance element having one end connected to said control terminal of said second transistor.

4. The frequency dividing circuit according to claim 1, wherein said booster circuit comprises:

a first transistor having a first side terminal supplied with an input voltage;

a capacitance element having one end connected to a second side terminal of said first transistor;

a second transistor having a first side terminal connected to a control terminal of said first transistor; and a third transistor having a first side terminal connected to said control terminal of said first transistor, and a second side terminal connected to second side terminal of said first transistor.

5. The frequency dividing circuit according to claim 4, wherein said booster circuit further comprises:

a delay circuit connected to another end of said capacitance element.

6. The frequency dividing circuit according to claim 1, wherein said booster circuit comprises:

a first transistor having a first side terminal supplied with an input voltage;

a capacitance element having one end connected to a second side terminal of said first transistor;

a second transistor having a first side terminal connected to a control terminal of said first transistor; and a resistance element having a first side terminal connected to said control terminal of said first transistor, and a second side terminal connected to said second side terminal of said first transistor.

7. The frequency dividing circuit according to claim 6, wherein said booster circuit further comprises:

a delay circuit connected to another end of said capacitance element.

8. The frequency dividing circuit according to claim 1, wherein said input circuit further comprises:

a level shifter converting one side level of said input signal to a voltage level of said booster voltage and outputting said converted input signal to said first stage unit frequency dividing circuit as said signal related to said input signal.

9. A power supply circuit comprising:

a frequency dividing circuit; and a first booster circuit outputting a first booster voltage based on the output of said frequency dividing circuit, wherein said frequency dividing circuit comprising:

a plurality of cascade-connected unit frequency dividing circuits; and a second booster circuit supplying a second booster voltage to at least a first stage of said plurality of cascade-connected unit frequency dividing circuits, wherein at least said first stage unit frequency dividing circuit consists of a part of said plurality of unit frequency dividing circuits, and wherein at least said first stage unit frequency dividing circuit is supplied with said first booster voltage instead of said second booster voltage when said first booster voltage becomes higher than a prescribed value.

10. The power supply circuit according to claim 9, wherein at least said first stage unit frequency dividing circuit comprises:

at least a first unit in the first stage frequency dividing circuit supplied with said second booster voltage; and at least a second unit in the first stage frequency dividing circuit supplied with said first booster voltage, the switching between at least said first unit in the first stage frequency dividing circuit and at least said second unit in the first stage frequency dividing circuit being done based on whether said first booster becomes higher than said prescribed value.

11. The power supply circuit according to claim 10, wherein said frequency dividing circuit further comprises:

a second level shifter converting one side level of said input signal to a voltage level of said first booster voltage and outputting to said second unit frequency dividing circuit.

12. A display device comprising:

a display element;

a drive circuit driving said display element; and a power supply circuit supplying a first booster voltage to said drive circuit, wherein said power supply current comprising:

a frequency dividing circuit; and a first booster circuit outputting a first booster voltage based on the output of said frequency dividing circuit, wherein said frequency dividing circuit comprising:

a plurality of cascade-connected unit frequency dividing circuits; and a second booster circuit supplying a second booster voltage to at least a first stage of said plurality of cascade-connected unit frequency dividing circuits, wherein at least said first stage unit frequency dividing circuit consists of a part of said plurality of unit frequency dividing circuits, and wherein at least said first stage unit frequency dividing circuit is supplied with said first booster voltage instead of said second booster voltage when said first booster voltage becomes higher than a prescribed value.

13. The display device according to claim 12, wherein said display element is a liquid crystal element.

14. The display device according to claim 12, wherein said display element is an electro-luminescence element.

15. The frequency dividing circuit of claim 1, wherein said booster circuit is configured to supply the boosted voltage to at least one of said plurality of cascade-connected unit frequency dividing circuits, other than said at least one of said plurality of cascade-connected unit frequency dividing circuits that is supplied with the power supply voltage less than the boosted voltage.

* * * * *